(12) United States Patent
Kang et al.

(10) Patent No.: US 8,796,707 B2
(45) Date of Patent: Aug. 5, 2014

(54) LIGHT EMITTING DEVICE AND LIGHT EMITTING DEVICE PACKAGE HAVING THE SAME

(75) Inventors: Dae Sung Kang, Gwangju (KR); Myung Hoon Jung, Busan (KR)

(73) Assignee: LG Innotek Co., Ltd., Seoul (KR)

( * ) Notice: Subject to any disclaimer, the term of this patent is extended or adjusted under 35 U.S.C. 154(b) by 347 days.

(21) Appl. No.: 12/768,478

(22) Filed: Apr. 27, 2010

(65) Prior Publication Data

US 2010/0295015 A1    Nov. 25, 2010

(30) Foreign Application Priority Data

May 21, 2009 (KR) .................. 10-2009-0044292

(51) Int. Cl.
*H01L 33/12* (2010.01)
(52) U.S. Cl.
USPC .................................... 257/98; 257/E33.068
(58) Field of Classification Search
CPC ...................................................... H01L 33/12
USPC ............. 257/79, 98, 190, 617, 103, E21.125, 257/E33.068
See application file for complete search history.

(56) References Cited

U.S. PATENT DOCUMENTS

| | | | |
|---|---|---|---|
| 6,657,236 B1 * | 12/2003 | Thibeault et al. | 257/98 |
| 7,101,444 B2 | 9/2006 | Shchukin et al. | |
| 2003/0134446 A1 * | 7/2003 | Koike et al. | 438/41 |
| 2003/0143771 A1 | 7/2003 | Kidoguchi et al. | |
| 2005/0042787 A1 * | 2/2005 | Ito et al. | 438/41 |
| 2005/0077512 A1 | 4/2005 | Yoon et al. | |
| 2005/0129957 A1 * | 6/2005 | Kashiwagi et al. | 428/413 |
| 2006/0086942 A1 * | 4/2006 | Wu et al. | 257/98 |
| 2007/0290230 A1 * | 12/2007 | Kawaguchi et al. | 257/196 |
| 2008/0169482 A1 | 7/2008 | Kang | 257/98 |
| 2008/0315226 A1 | 12/2008 | Kuo et al. | |
| 2009/0272993 A1 | 11/2009 | Cheong | 257/94 |

FOREIGN PATENT DOCUMENTS

| | | |
|---|---|---|
| EP | 1 104 031 A2 | 5/2001 |
| JP | 2002-009004 | 1/2002 |
| JP | 2002175985 | 6/2002 |
| KR | 100863804 | 10/2008 |
| TW | 2009-08374 | 2/2009 |

OTHER PUBLICATIONS

English machine translation of KR100863804 to Kim et al.*
European Search Report dated Dec. 5, 2013 issued in Application No. 10 16 2491.
Chinese Patent Publication 101901859 dated Jan. 23, 2013 (family application of present application).

* cited by examiner

*Primary Examiner* — Yu Chen
(74) *Attorney, Agent, or Firm* — KED & Associates LLP

(57) ABSTRACT

A light emitting device includes a plurality of clusters spread on a surface of a substrate and a first semiconductor layer provided over the plurality of clusters. The first semiconductor layer may includes air gaps above the plurality of clusters. In addition, light emitting structure may include a first conductive semiconductor layer adjacent to the first semiconductor layer, an active layer on the first conductive semiconductor layer, and a second conductive semiconductor layer on the active layer.

20 Claims, 7 Drawing Sheets

LIGHT EMITTING DEVICE AND LIGHT EMITTING DEVICE PACKAGE HAVING THE SAME

CROSS-REFERENCE TO RELATED APPLICATION(S)

This application claims priority under 35 U.S.C. §119 to Korean Application No. 10-2009-0044292, filed on May 21, 2009, the contents of which are incorporated herein by reference.

BACKGROUND

1. Field

One or more embodiment described herein relate emission of light.

2. Background

Light emitting diodes (LEDs) and laser diodes (LDs) may be used as light sources for key pads of portable phones, electric bulletin boards, and other types of electronic and/or illumination devices. However, improvements are needed for such devices.

BRIEF DESCRIPTION OF THE DRAWINGS

The embodiments will be described in detail with reference to the following drawings in which like reference numerals refer to like elements wherein.

DETAILED DESCRIPTION

Figure 1:
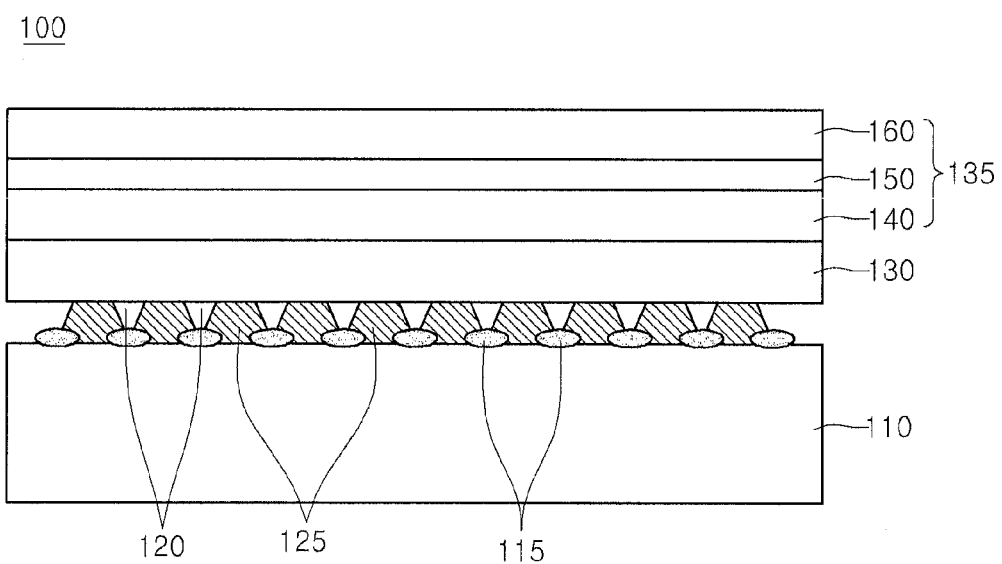
FIG. 1 is a diagram showing a first embodiment of a light emitting device.

FIG. 1 shows a first embodiment of a light emitting device 100 which includes a substrate 110, a cluster layer 115, a first porous semiconductor layer 125 having holes, a second semiconductor layer 130, a first conductive semiconductor layer 140, an active layer 150, and a second conductive semiconductor layer 160.

The substrate 110 includes a conductive substrate or an insulating substrate. For instance, the substrate 110 may include at least one of $Al_2O_3$, SiC, Si, GaAs, GaN, ZnO, Si, GaP, InP, $Ga_2O_3$, and Ge. A concave-convex structure can be formed on the substrate 110, but the embodiment is not limited thereto.

The cluster layer 115 is formed on the substrate 110. The cluster layer 115 can be formed on the substrate 110 with a random shape and a random size. The random shape may include a substantially spherical shape, elliptical shape, polygonal shape, or another geometric shape. In other embodiments, the shape may be an irregular shape.

The cluster layer 115 may selected to include one or more Group II elements. According to one embodiment, the cluster layer 115 may include a MgN seed layer or a Mg cluster layer. The cluster of the cluster layer 115 may have a size in the range of few angstroms to several thousands of angstroms (for instance, 1 Å to 9000 Å). In addition, the cluster layer 115 may be formed at one or more regular intervals or/and predetermined shapes, or the cluster layer may be formed at irregular intervals according to one or more of the aforementioned shapes.

The substrate 110 is exposed through openings formed between the cluster layers 115. The first semiconductor layer 125 is formed on the substrate 110 and can be formed on the substrate 110 and the cluster layer 115.

The first semiconductor layer 125 may be formed to include a plurality of holes, at least one hole serving as an air gap in the first semiconductor layer 125. The first semiconductor layer 125 may also include a buffer layer, an undoped semiconductor layer, a nonconductive semiconductor layer or a conductive semiconductor layer formed using one or more Group III-V compound semiconductors.

In addition, the first semiconductor layer 125 may selectively include semiconductor material of $In_xAl_yGa_{1-x-y}N$ ($0 \leq x \leq 1$, $0 \leq y \leq 1$, $0 \leq x+y \leq 1$). The conductive semiconductor layer may include a semiconductor layer doped with a dopant corresponding to a first conductivity or a dopant of a second conductivity.

Most of the first semiconductor layer 125 is formed on the substrate 110 and a part of the first semiconductor layer 125 is formed on a part of the cluster layer 115. A combination force between the substrate 110 and the cluster layer 115 may be weaker than a combination force between the first semiconductor layer 125 and the substrate 110. Thus, a contact area between the first semiconductor layer 125 and the cluster layer 115 may be made to be smaller than a contact area between the first semiconductor layer 125 and the substrate 110. The cluster layer 115 may therefore be considered as a weak-combination cluster layer, having a weak combination force relative to the nitride semiconductor and as compared with the substrate 110.

The first semiconductor layer 125 also includes porous air gaps 120 formed on the cluster layer 115. The air gaps 120 can be formed on the whole area or a part of the cluster layer 115, which may vary depending on the size of the cluster of the cluster layer 115. The air gap 120 serves an air layer formed in the first semiconductor layer 125 and may, for example, have a refractive index of 1. Other embodiments may have a different refractive index.

The air gap 120 may have various shapes according to a growth condition of the first semiconductor layer 125. For instance, the air gap 120 is gradually widened from a lower portion to an upper portion thereof, e.g., each air gap 120 may have a column shape, a reverse conical shape, or a reverse pyramidal shape, but the embodiments are not limited to these exemplary shapes. The air gaps 120 may be offset from regions where the cluster layer 115 is not formed or may be aligned with the clusters 115.

The air gaps 120 are formed in the first semiconductor layer 125 to serve as a buffer for accumulating relaxation strain of the first semiconductor layer 125. The air gaps 120 can reduce the number of or prevent the formation of defective areas in the first semiconductor layer 125.

The air gaps 120 can reduce the actual contact area between the first semiconductor layer 125 and the substrate 110. Because the contact area between the first semiconductor layer 125 and the substrate 110 can be reduced, the number of defects in the first semiconductor layer 125 can be reduced or eliminated. For example, the number or existence of cracks in the first semiconductor layer 125 can be reduced.

The second semiconductor layer 130 is formed on the first semiconductor layer 125. The second semiconductor layer 130 can be formed by using semiconductor material identical to or different from semiconductor material for the first semiconductor layer 125. For instance, the semiconductor material may be formed to include one or more Group III-V compound semiconductors having a chemical formula of $In_xAl_yGa_{1-x-y}N$ ($0 \leq x \leq 1$, $0 \leq y \leq 1$, $0 \leq x+y \leq 1$). The second semiconductor layer 130 may include a semiconductor doped with the first conductive dopant or a substantially undoped semiconductor.

The second semiconductor layer 130 may include a super lattice structure therein. The super lattice structure can be realized by repeatedly forming GaN/AlGaN layers. The super lattice structure can further remove or suppress the defects of the first semiconductor layer 130, and/or may serve to relieve strain for or between the surface of one or both of the first semiconductor layer and the second semiconductor layer 130.

The under surface of the second semiconductor layer 130 may have a concave-convex shape due to the air gaps 120, but the embodiments described herein are not limited thereto. The first and second semiconductor layers 125 and 130 may have a single layer structure.

The upper surface of the second semiconductor layer 130 may be planarized. The growth condition for the second semiconductor layer 130 is controlled such that more horizontal growth is promoted than vertical growth. Thus, the upper portion of the second semiconductor layer 130 may be integrally combined and have a flat upper surface. The second semiconductor layer 130 can be prepared as a crack-free layer due to the air gaps 120 and the cluster layer 115.

There may be a great difference in the refractive index at the boundary surface between the semiconductor layers 125 and 130 and air gaps 120. For this reason, light directed toward the semiconductor layers may be refracted or reflected. Thus, the critical angle of light may be changed so that external quantum efficiency can be improved.

Since GaN has a refractive index of about 2.5 and air has a refractive index of 1, light can be extracted when the critical angle of the light is about 23.58° or above at the boundary surface between the GaN and the air. The present embodiment may therefore serve as a light-extracting structure having air between the GaN and the sapphire substrate.

A light emitting structure 135 can be formed on the second semiconductor layer 130. The light emitting structure 135 may include the first conductive semiconductor layer 140, the active layer 150 and the second conductive semiconductor layer 160.

The first conductive semiconductor layer 140 may include one or more Group III-V compound semiconductors doped with a first conductivity dopant. If the first conductivity semiconductor layer 140 is an N type semiconductor layer, the first conductivity dopant may be an N-type dopant including one or more of Si, Ge, Sn, Se, or Te. In addition, if the second semiconductor layer 130 is the first conductivity type, the first conductivity semiconductor layer 140 may be omitted.

The active layer 150 is formed on the first conductive semiconductor layer 140. The active layer 150 may include one or more Group III-V compound semiconductors. The active layer 150 may have one of a single quantum well structure, a multiple quantum well (MQW) structure, a quantum dot structure or a quantum wire structure. The active layer 150 has a well/barrier layer which is prepared as a pair structure, such as an InGaN/GaN layer, a GaN/AlGaN layer or an InGaN/InGaN layer, but the embodiments are not limited thereto. The well layer includes material having a band gap lower than that of the barrier layer.

The conductive clad layer may be aligned on and/or under the active layer 150. The conductive clad layer includes an AlGaN-based semiconductor and has a band gap higher than that of the active layer 150.

The second conductive semiconductor layer 160 is formed on the active layer 150. The second conductive semiconductor layer 160 may include one or more Group III-V compound semiconductors doped with a second conductivity dopant. For instance, the second conductivity semiconductor layer 160 may include semiconductor material having the chemical formula of $In_xAl_yGa_{1-x-y}N$ ($0 \leq x \leq 1$, $0 \leq y \leq 1$, $0 \leq x+y \leq 1$). If the second conductivity semiconductor layer 160 is a P-type semiconductor layer, the second conductivity dopant is a p-type dopant including one or more of Mg, Zn, Ca, Sr, or Ba.

Due to the air gaps 120 and the cluster layer 115, the light emitting structure 135 may have a substantially crack-free layer on the first semiconductor layer 125. The crack-free layer may prevent current concentration and protect the active layer 150, thereby improving internal quantum efficiency as well as the external quantum efficiency.

Transmissive electrode material and/or reflective electrode material may be formed on the second conductivity semiconductor layer 160. The electrode material forms at least one of a transparent electrode layer, a reflective electrode layer and an electrode structure. The transparent electrode layer may include insulating material or conductive material which selectively includes oxide and nitride. For instance, the transparent electrode layer may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), ZnO, IrOx, RuOx, and NiO. In addition, the transparent electrode layer may include one selected from the group consisting of Ag, Ni, Al, Rh, Pd, Ir, Ru, Mg, Zn, Pt, Au, Hf and a combination thereof.

In addition, the electrode layer may include reflective electrode material having an ohmic characteristic. Material having the ohmic characteristic can be formed in a predetermined pattern between the electrode layer and the second conductive semiconductor layer 160, but the embodiment is not limited thereto.

The first conductivity semiconductor layer may include a P-type semiconductor layer and the second conductivity semiconductor layer 160 may include an N-type semiconductor layer. In addition, a semiconductor having polarity opposite to polarity of the second type may be formed on the second conductivity semiconductor layer 160. For instance, the N-type semiconductor layer can be formed on the second conductivity semiconductor layer 160. Thus, the light emitting structure 135 may include one of an N-P junction structure, a P-N junction structure, an N-P-N junction structure or a P-N-P junction structure.

The cluster layer 115 may be formed on the buffer layer employing one or more Group III-V compound semiconductors or on the undoped semiconductor layer. The buffer layer may reduce difference in a lattice constant with respect to substrate 110 while preventing deformation caused by difference in thermal expansion with respect to the substrate 110.

The undoped semiconductor layer may be formed on the buffer layer or the substrate 110 to reduce the defects in the substrate 110.

The cluster layer 115 and the air gaps 120 are aligned between the buffer layer and the undoped semiconductor layer. The cluster layer 115 and the air gaps 120 can be provided between a plurality of undoped semiconductor layers. In addition, the cluster layer 115 and the air gaps 120 can be provided between a plurality of the first conductivity semiconductor layers 140. Further, a plurality of the cluster layers 115 and the air gaps 120 can be provided under the active layer 150 to improve the light extracting efficiency of the light emitting structure.

Figure 2:
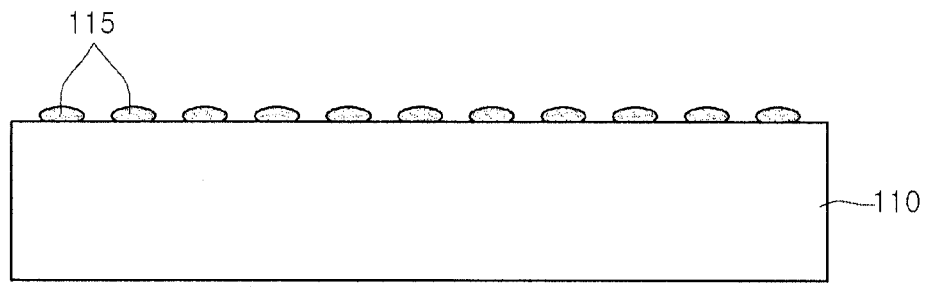
FIGS. 2 to 5 are diagrams corresponding to a manufacturing process that may be used the light emitting device of FIG. 1.

FIGS. 2 to 5 show different stages of a manufacturing process for the light emitting device of FIG. 1. Referring to FIG. 2, the substrate 110 is loaded in growth equipment and the loaded substrate 110 is subject to the heat treatment process. The cluster layer 115 is formed on the substrate. The growth equipment may include E-beam deposition, PVD (physical vapor deposition), CVD (chemical vapor deposition), PLD (plasma laser deposition), dual-type thermal evaporator, sputtering, and MOCVD (metal organic chemical vapor deposition), but the embodiments are not limited thereto.

The substrate 110 may include at least one of $Al_2O_3$, SiC, Si, GaAs, GaN, ZnO, Si, GaP, InP, or Ge. The concave-convex structure may be formed on the substrate 110, but the embodiments are not limited thereto.

The cluster layer 115 may include a MgN seed layer or Mg cluster. In order to form the MgN seed layer, carrier gas ($H_2$ or $N_2$) is supplied under the growth temperature of about 500~1100° C. and nitrification treatment is performed using $NH_3$ under predetermined pressure condition (for instance, 50 to 500 torrs). At this time, Mg which is a Group II element is supplied to form a seed layer including MgN. The cluster size of the MgN seed layer can be changed depending on the flow rate of Mg.

The cluster layer 115 may include one or more Group II elements. For instance, the cluster layer 115 may include a MgN seed layer or the Mg cluster layer. The clusters in cluster layer 115 may have a size in the range of few angstroms to several thousands of angstroms (for instance, 1 Å to 9000 Å). In addition, adjacent clusters may be connected to each other without limitation and directly or indirectly. The MgN seed layer is a nonconductive layer which can diffuse current when a conductive substrate including Si is provided.

The cluster layer 115 may be irregularly formed on the substrate 110 with a random shape and a random size. The random shape includes any of the shapes previously mentioned including but not limited to a spherical shape, elliptical shape, or a polygonal shape. The substrate 110 is exposed through predetermined regions of the cluster layer 115 where the cluster is not formed.

Another semiconductor layer, such as a buffer layer and/or an undoped semiconductor layer, may be formed between the cluster layer 115 and the substrate 110. The buffer layer may include the compound semiconductor employing one or more Group II to VI elements and may reduce a difference in a lattice constant with respect to the substrate 110. The undoped semiconductor layer may be formed on the buffer layer or the substrate 110. The undoped semiconductor layer may include an undoped GaN-based semiconductor. For the purpose of convenience of explanation, the following description will be made on the assumption that the cluster layer 115 is formed on the substrate 110.

Figure 3:
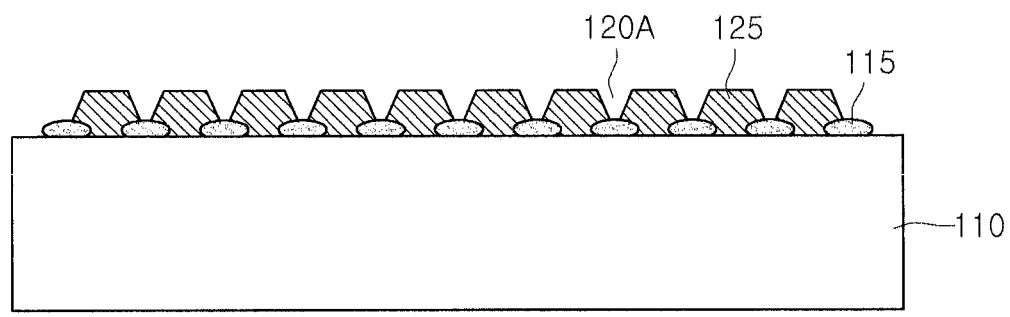

Referring to FIG. 3, the first semiconductor layer 125 is formed on the substrate 110. The first semiconductor layer 125 may include an undoped semiconductor layer or a conductive semiconductor layer employing one or more Group III-V compound semiconductors. For example, the first semiconductor layer 125 may include semiconductor material having the chemical formula of $In_xAl_yGa_{1-x-y}N$ ($0 \le x \le 1$, $0 \le y \le 1$, $0 \le x+y \le 1$). The first semiconductor layer 125 may include a semiconductor layer doped with a dopant of a first conductivity type dopant of a second conductivity type.

Most of the first semiconductor layer 125 may be primarily grown from a predetermined region of the substrate 110 where the cluster layer 115 is not formed, and then a portion of the first semiconductor layer 125 may be grown on cluster layer 115.

The first semiconductor layer 125 may be easily grown on the surface of the substrate 110 as compared with the surface of cluster layer 115. In addition, a combination force between the semiconductor material of the first semiconductor layer 125 and the substrate 110 may be stronger than a combination force between the semiconductor material of the first semiconductor layer 125 and the cluster layer 115. Thus, cluster layer 115 may be considered as a weak-combination cluster layer.

The first semiconductor layer 125 may be grown from the upper surface of the substrate 110. At this time, the upper surface of the cluster layer 115 may serve as an air gap area 120A where the semiconductor is not present.

When the first semiconductor layer 125 includes GaN, for example, a Group III gas such as TMGa or TEGa may be used as source gas for Ga, and a Group V gas such as $NH_3$, MMHy or DMHy may be used as source gas for N, but different gases may be used in other embodiments.

The first semiconductor layer 125 may be grown by controlling one or more growth conditions such as growth temperature, the ratio between Group V gas and Group III gas, and growth pressure. In order to promote vertical growth of the first semiconductor layer 125, growth pressure may be relatively increased, growth temperature may be relatively lowered, and the flow rate of Ga may be relatively increased.

At this time, air gap area 120A may be formed in the first semiconductor layer 125. The air gap area 120A may be gradually widened from the lower portion to the upper portion thereof. For instance, the air gap area 120A may have a column shape, a reverse conical shape, or a reverse pyramidal shape. The contact area between the first semiconductor layer 125 and the cluster layer 115 may be smaller than the contact area between the first semiconductor layer 125 and the substrate 110.

Figure 4:
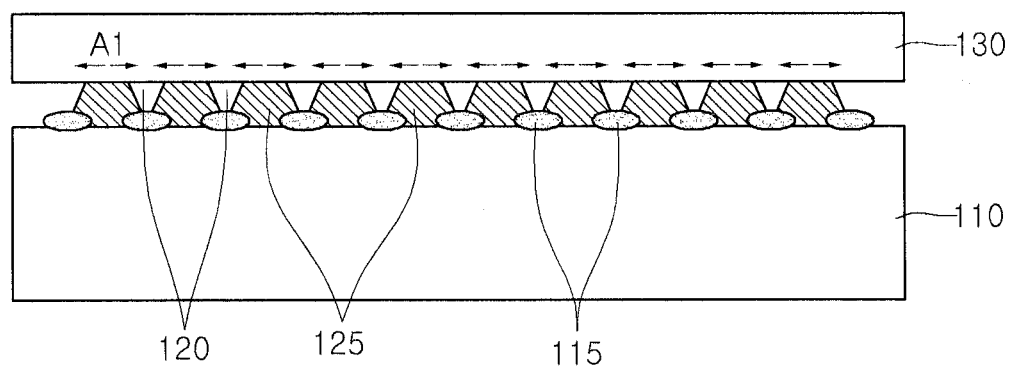

Referring to FIGS. 3 and 4, the second semiconductor layer 130 is formed on the first semiconductor layer 125. The second semiconductor layer 130 is grown while expanding to the upper portion of the air gap area 120A. Then, the second semiconductor layer 130 is integrally combined on the air gap area 120A, thereby sealing on the air gap area 120A. Thus, the first semiconductor layer 125 can be obtained with the air gap area 120A.

The second semiconductor layer 130 may be formed using semiconductor material identical to or different from semiconductor material for the first porous semiconductor layer 125. For instance, the semiconductor material may include one or more Group III-V compound semiconductors such as one having a chemical formula of $In_xAl_yGa_{1-x-y}N$ ($0 \le x \le 1$, $0 \le y \le 1$, $0 \le x+y \le 1$).

The growth condition for the second semiconductor layer 130 may be controlled such that the horizontal growth is promoted rather or more than vertical growth. In this case, the second semiconductor layer 130 may be integrally combined on the air gaps 120 and has a flat upper surface. In order to promote the horizontal growth of the second semiconductor layer 130, when the second semiconductor layer 130 includes GaN, a Group III gas such as TMGa or TEGa may be used as source gas for Ga and a Group V gas such as $NH_3$, MMHy or DMHy may be used as source gas for N, but the embodiments herein are not limited thereto.

The second semiconductor layer 130 can be grown by controlling one or more growth conditions such as growth temperature, the ratio between Group V gas and Group III gas, and growth pressure. In order to promote the horizontal growth of the second semiconductor layer 130, the growth temperature may be gradually increased, growth pressure relatively lowered, and the flow rate of Ga relatively reduced in comparison with the growth conditions for the first semiconductor layer 125. In this case, the second semiconductor layer 130 may integrally combined and an upper surface of the second semiconductor layer 130 has a flat surface. The above growth conditions in other ways in other embodiments or a different set of growth conditions may be controlled.

The second semiconductor layer 130 may include a semiconductor doped with the dopant of first conductivity type or an undoped semiconductor. The second semiconductor layer 130 can be formed on the first semiconductor layer 125 as a crack-free layer due to the air gaps 120.

The air gap 120 may be an air layer having a refractive index of 1. Due to the air gap 120, the critical angle of the light can be changed at the boundary surface between the semiconductor layers 125 and 130 and the air gap 120, so that the external quantum efficiency can be improved.

The air gaps 120 formed in the first semiconductor layer 125 may serve as a buffer for accumulating relaxation strain of the first semiconductor layer 125. A concave-convex section may be formed on the under surface of the second semiconductor layer 130 due to the air gaps 120.

Figure 5:
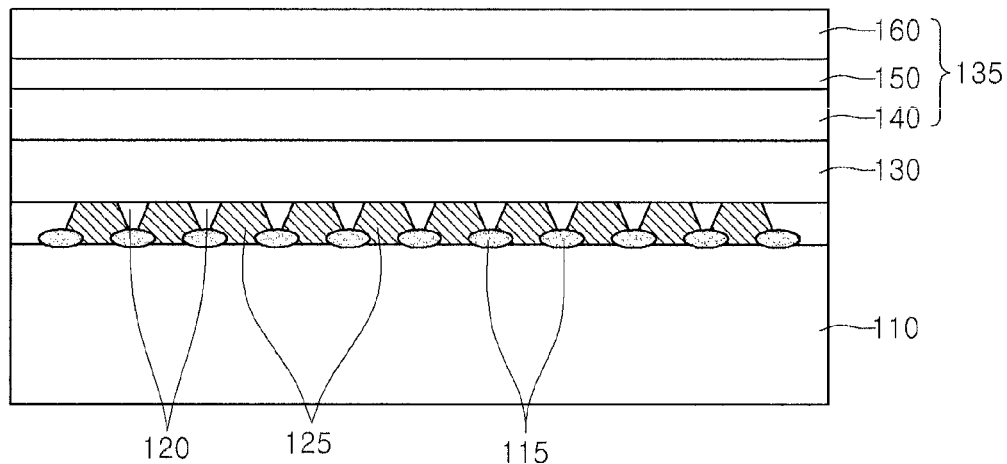

Referring to FIG. 5, light emitting structure 135 may be formed on the second semiconductor layer 130. The light emitting structure 135 may include the first conductive semiconductor layer 140, active layer 150, and second conductive semiconductor layer 160.

The first conductive semiconductor layer 140 may include one or more Group III-V compound semiconductors doped with a dopant of a first conductivity type. For instance, the first conductivity semiconductor layer 140 may include a semiconductor material having the chemical formula of $In_xAl_yGa_{1-x-y}N$ ($0 \leq x \leq 1$, $0 \leq y \leq 1$, $0 \leq x+y \leq 1$).

If the first semiconductor layer 140 may be an N-type semiconductor layer and the dopant may be an N-type dopant including, for example, one or more Si, Ge, Sn, Se, or Te. In addition, if the second semiconductor layer 130 is of a first conductivity type, the first conductive semiconductor layer 140 may be omitted.

The active layer 150 is formed on the first conductive semiconductor layer 140. The active layer 150 may include one or more Group III-V compound semiconductors. The active layer 150 may have one of a single quantum well structure, a multiple quantum well (MQW) structure, a quantum dot structure or a quantum wire structure. The active layer 150 may have a well/barrier layer which is prepared to have a dual structure such as an InGaN/GaN layer, a GaN/AlGaN layer or an InGaN/InGaN layer, but the embodiments described herein are not limited thereto. The well layer may include material having a band gap lower than that of the barrier layer.

The conductive clad layer (not shown) may be aligned on and/or under the active layer 150. The conductive clad layer may include an AlGaN-based semiconductor and has a band gap higher than that of the active layer 150.

The second conductive semiconductor layer 160 may be formed on the active layer 150. The second conductive semiconductor layer 160 may include one or more Group III-V compound semiconductors doped with a second conductivity dopant. For instance, the second conductivity semiconductor layer 160 may include semiconductor material having the chemical formula of $In_xAl_yGa_{1-x-y}N$ ($0 \leq x \leq 1$, $0 \leq y \leq 1$, $0 \leq x+y \leq 1$). If the second conductivity semiconductor layer 160 is a P-type semiconductor layer, the second conductivity dopant may be a P-type dopant including, for example, one or more of Mg, Zn, Ca, Sr, or Ba.

At least one of a transmissive electrode (not shown), a reflective layer or a second electrode may be formed on the second conductivity semiconductor layer 160. The first semiconductor layer of a first conductivity type may include a P-type semiconductor layer, and the second conductivity semiconductor layer 160 of a second conductivity type may include an N-type semiconductor layer. In addition, an N-type semiconductor layer or a P-type semiconductor layer can be formed on the second semiconductor layer 160. The light emitting structure 135 may include one of an N-P junction structure, a P-N junction structure, an N-P-N junction structure or a P-N-P junction structure.

Figure 6:
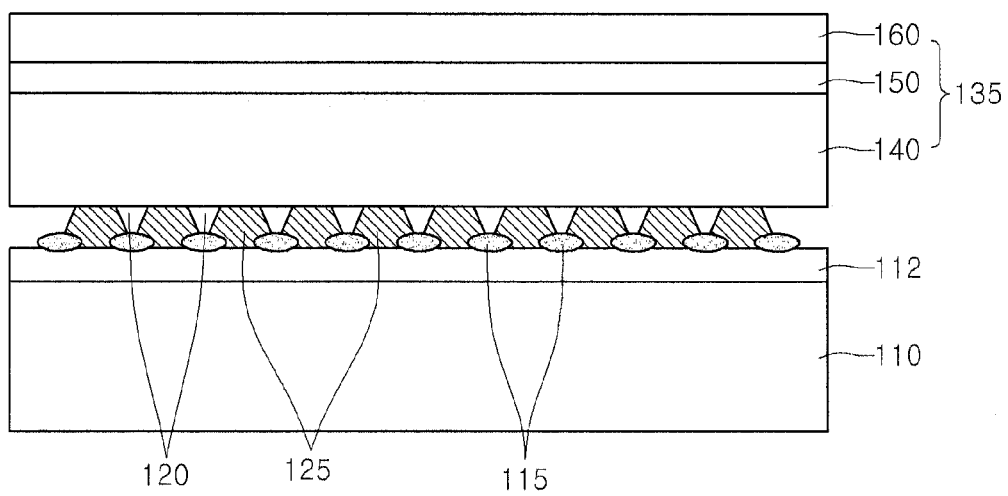
FIG. 6 is a diagram showing a second embodiment of a light emitting device.

FIG. 6 shows a second embodiment of a light emitting device. In the second embodiment, the same reference numerals will be assigned to the elements identical to the elements of the first embodiment and detailed description thereof will be omitted in order to avoid redundancy.

Referring to FIG. 6, light emitting device 101 includes a substrate 110, a buffer layer 112, a cluster layer 115, a first semiconductor layer 125, air gaps 120, a first conductivity semiconductor layer 140, an active layer 150, and a second conductivity semiconductor layer 160. The substrate 110 may include at least one of $Al_2O_3$, SiC, Si, GaAs, GaN, ZnO, Si, GaP, InP, or Ge, and a concave-convex structure may be formed on the substrate 110.

The buffer layer 112 may be formed on the substrate 110. The buffer layer 112 may attenuate the lattice mismatch between GaN material and the substrate 110. The buffer layer 112 may include one or more Group III-V compound semiconductors. For instance, the buffer layer 112 may include at least one of GaN, InN, AlN, InGaN, AlGaN, InAlGaN, or AlInN. The undoped semiconductor layer may be formed on the buffer layer 112, but the embodiments are not limited thereto.

The cluster layer 115 is formed on the buffer layer 112. The clusters of the cluster layer 115 may be irregularly formed with a random shape and a random size. The cluster layer 115 may include a MgN seed layer or a Mg cluster layer. The MgN seed layer may have a nonconductor characteristic so that a vertical structure can be obtained when the substrate 110 is a conductive substrate including Si and current applied to the conductive substrate can be diffused.

The first semiconductor layer 125 is formed on the buffer layer 112. The first semiconductor layer 125 may include an undoped semiconductor layer or a conductive semiconductor layer employing one or more Group III-V compound semiconductors. The first semiconductor layer 125 may include semiconductor material having the chemical formula of $In_xAl_yGa_{1-x-y}N$ ($0 \leq x \leq 1$, $0 \leq y \leq 1$, $0 \leq x+y \leq 1$). The first semiconductor layer 125 may include a semiconductor layer doped with a first conductivity dopant and/or a second conductivity dopant.

Most semiconductor material of the first semiconductor layer 125 is grown on the buffer layer 112. The semiconductor material is rarely grown on the cluster layer 115. The air gap 120 is formed on at least one cluster of the cluster layer 115.

The air gap 120 is an air layer formed on the cluster layer 115 and has a refractive index of 1. The air gap 120 may have various shapes according to the growth conditions of the first semiconductor layer 125. In other embodiments, different growth conditions may be used.

The air gaps 120 are distributed in the first semiconductor layer 125 to serve as a buffer for accumulating relaxation strain of the first semiconductor layer 125. Thus, the first semiconductor layer 125 may be substantially free of cracks.

The first conductive semiconductor layer 140 is formed on the first semiconductor layer 125 and the air gaps. The first conductive semiconductor layer 140 can be formed by using semiconductor material identical to or different from semiconductor material for the first semiconductor layer 125.

The upper surface of the first conductive semiconductor layer 140 can be flat. That is, when the first conductive semiconductor layer 140 is grown, horizontal growth of the first conductive semiconductor layer 140 may be promoted and the first conductive semiconductor layer 140 may be integrally combined therewith so that the planar upper surface of the first conductive semiconductor layer 140 can be obtained.

The active layer 150 is formed on the first conductive semiconductor layer 140. The conductive clad layer (not shown) can be aligned on and/or under the active layer 150. The conductive clad layer may include, for example, an AlGaN-based semiconductor. The second conductive semiconductor layer 160 is formed on the active layer 150.

Due to the air gaps 120, the first conductive semiconductor layer 140 and the semiconductor layers formed on the first conductivity semiconductor layer 140 can be formed as crack-free layers. The crack-free layers may prevent current concentration and protect the active layer 150, thereby improving internal quantum efficiency as well as external quantum efficiency.

At least one of a transparent electrode layer (not shown), a reflective electrode layer or a second electrode may be formed on the second conductivity semiconductor layer 160. Thus, the light emitting structure 135 may include one of an N-P junction structure, a P-N junction structure, an N-P-N junction structure or a P-N-P junction structure.

According to one embodiment, the cluster layer 115 and the air gaps 120 may be formed in at least one position between the substrate and the undoped semiconductor layer, between the buffer layer and the undoped semiconductor layer, between the buffer layer and the first conductive semiconductor layer, and/or between the first conductivity semiconductor layers. The cluster layer 115 and the air gaps 120 can be formed in different positions between the active layer 150 and the substrate 110.

The crack-free nitride semiconductor layer can be grown due to the cluster layer 115 and the air gaps 120, so that electric characteristics of the light emitting device 101 can be improved. The light emitting device 101 can achieve improved external quantum efficiency by utilizing a medium difference among the cluster layer 115, the air gaps 120 and the semiconductor layers 125 and 140.

Figure 7:
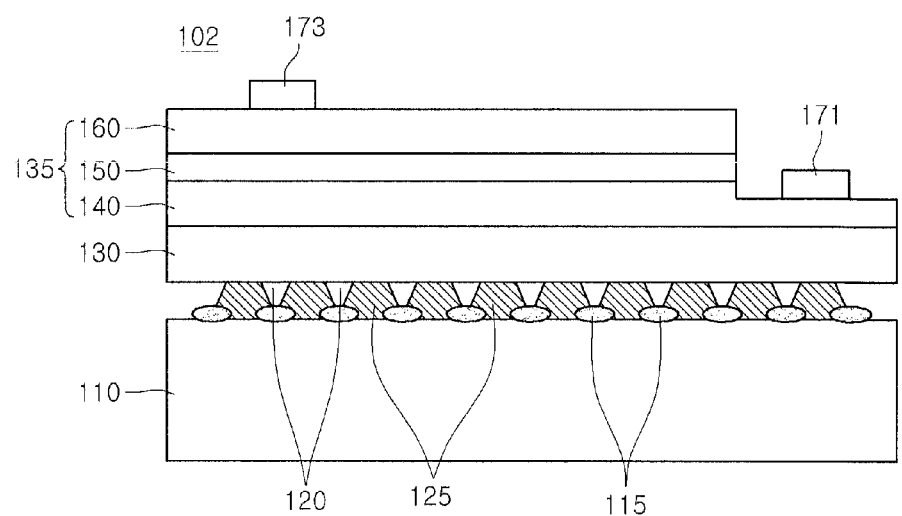
FIG. 7 is a diagram showing a sectional view of a lateral-type light emitting device employing the light emitting device of FIG. 1.

FIG. 7 shows a lateral-type light emitting device employing the light emitting device of FIG. 1. Referring to FIG. 7, the light emitting device 102 includes a second electrode 173 connected to the second conductivity semiconductor layer 160 and a first electrode 171 connected to the first conductivity semiconductor layer 140. The first and second electrodes 171 and 173 can be formed after the mesa etching process.

The second electrode 173 may be formed on the second conductivity semiconductor layer 160 and the first electrode 171 may be formed on the first conductivity semiconductor layer 140.

An electrode layer, such as a transparent electrode layer or a reflective electrode layer, may be formed on the conductive semiconductor layer 160 after or before the second electrode 173 has been formed, but the embodiments are not limited thereto. The electrode layer is disposed between the second electrode 173 and the semiconductor layer, that is, the second conductivity semiconductor layer or the N-type semiconductor layer.

Figure 8:
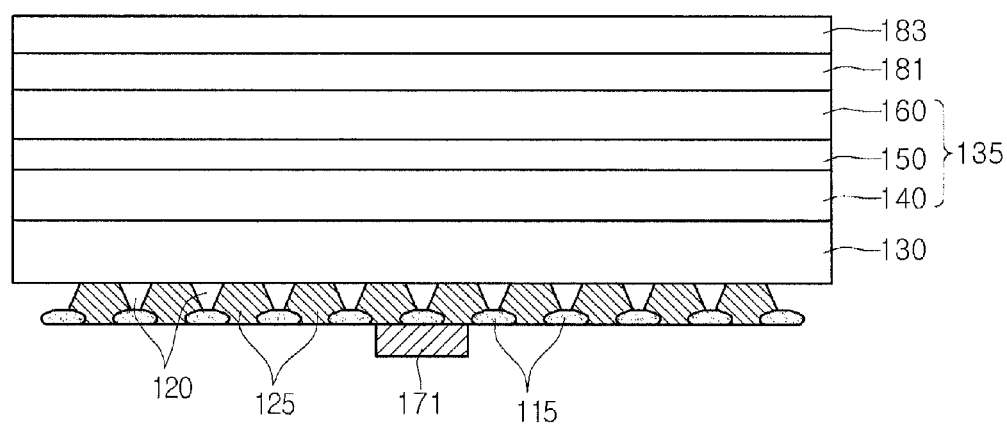
FIG. 8 is a diagram showing a vertical-type light emitting device employing the light emitting device of FIG. 1.

FIG. 8 shows a vertical-type light emitting device employing the light emitting device of FIG. 1. Referring to FIG. 8, the light emitting device 103 includes an electrode layer 181 formed on the light emitting structure 135 and a conductive support member 183 formed on the electrode layer 181.

The electrode layer 181 can be formed on the uppermost layer of the light emitting structure 135. The uppermost layer of the light emitting structure 135 may be a second conductivity semiconductor layer 160 or an N-type semiconductor layer having polarity opposite to that of the second type.

The electrode layer 181 may include conductive material which selectively includes transmittive oxide and nitride. For instance, the electrode layer 181 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), ZnO, IrOx, RuOx, and NiO. The electrode layer 181 can be prepared as a single-layer structure or a multi-layer structure using the above materials. When the electrode layer 181 has the multi-layer structure, at least one layer can be aligned in the form of a pattern.

The conductive support member 183 can selectively include one or more of Cu, Au, Ni, Mo, Cu—W, or a carrier wafer such as GaN, Si, Ge, GaAs, ZnO, SiGe, or SiC. A bonding layer can be disposed between the electrode layer 181 and the conductive support member 183. The bonding layer includes a barrier metal or a bonding metal. For instance, the bonding layer may include at least one of Ti, Au, Sn, Ni, Cr, Ga, In, Bi, Cu, Ag or Ta.

A channel layer including the transmissive conductive material or an insulating layer can be aligned on a peripheral portion between the electrode layer 181 and the light emitting structure 135. The insulating layer may include one or more of $SiO_2$, $SiO_x$, $SiO_xN_y$, $Si_3N_4$, $Al_2O_3$, or $TiO_2$.

After removing the substrate 110 (see, FIG. 1) from the under surface of the first semiconductor layer 125, the first electrode 171 is formed under the first semiconductor layer 125. In order to remove the substrate 110, an LLO (Laser Lift Off) scheme is performed.

According to the LLO scheme, after forming the conductive support member 183, a laser having a predetermined wavelength is irradiated onto the substrate, thereby removing the substrate. In addition, the substrate can be removed by injecting wet etchant into the first semiconductor layer 125 and/or the air gaps 120. In this case, the shape of the first semiconductor layer 125 and the air gaps 120 can be changed, but the embodiments are not limited thereto.

The boundary area between chips is etched, for example, through a dry etching and/or a wet etching. The first electrode 171 may make direct contact with the first semiconductor layer 125 and/or the cluster layer 115.

An ICP/RIE (Inductively coupled Plasma/Reactive Ion Etching) process can be performed with respect to the under surface of the first nitride semiconductor layer 125 where the substrate 110 has been removed, but the embodiments are not limited thereto. In this case, the cluster layer 115 can be removed. In addition, if the first semiconductor layer 125 is not the first conductivity type, the first semiconductor layer 125 can be removed, but the embodiments are not limited thereto.

The first electrode 171 can be formed after or before the chip is separated, but the embodiments are not limited thereto.

The light emitting device is diced into individual chips, for example, through an expanding and breaking process after the mesa-etching process. Although the embodiments have been described with reference to the light emitting device such as an LED, the embodiments can be applied to other semiconductor devices to be formed on the substrate.

Figure 9:
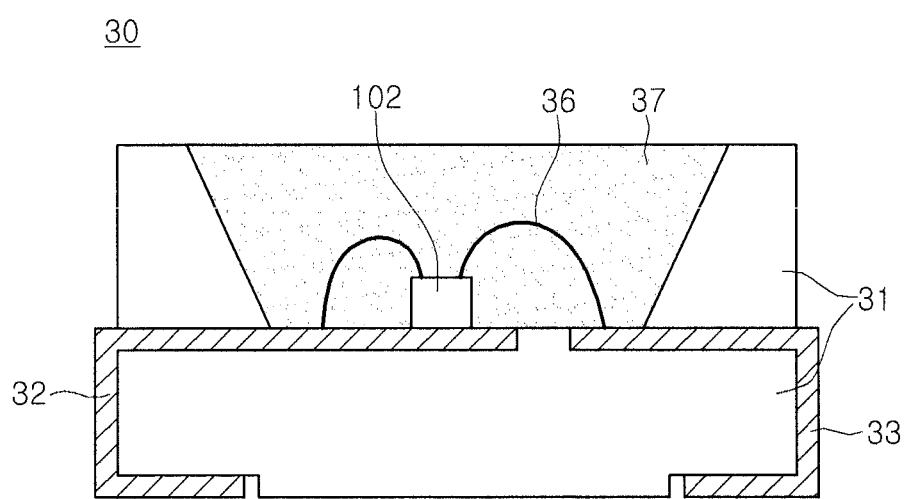
FIG. 9 is a diagram showing a light emitting device package employing the light emitting device of FIG. 7.

FIG. 9 shows a light emitting device package employing the light emitting device of FIG. 7. Referring to FIG. 9, the light emitting device package 30 includes a package body 31, first and second lead electrodes 32 and 33 installed on the package body 31, a light emitting device 102 according to the embodiment installed on the package body 31 and electrically connected to the first and second lead electrodes 32 and 33, and a molding member 37 surrounding the light emitting device 102.

The package body 31 may include silicon material, synthetic resin material, or metallic material. An inclined surface may be formed in the vicinity of the light emitting device 102. The package body 31 has a cavity structure having an open upper portion and the light emitting device 102 is installed in the cavity structure.

The first and second lead electrodes 32 and 33 are electrically separated from each other to supply power to the light emitting device 102. In addition, the first and second lead electrodes 32 and 33 reflect the light emitted from the light emitting device 102 to improve the light efficiency and dissipate heat generated from the light emitting device 102 to the outside.

The light emitting device 102 can be installed on the package body 31 or on the first and second lead electrodes 32 and 33.

The light emitting device 102 can be electrically connected to the first and second lead electrodes 32 and 33 through a wire 36. The light emitting devices disclosed in the above embodiments can be selectively employed in the light emitting package instead of the light emitting device 102 and the light emitting devices can be mounted through at least one of wiring, die bonding, or flip bonding schemes but the embodiments are not limited thereto.

The molding member 37 protects the light emitting device 102 by surrounding the light emitting device 102. The molding member 37 may include a phosphor to change the wavelength of the light emitted from the light emitting device 102.

The light emitting device according to the embodiments is packaged onto a semiconductor board including a resin or silicon, an insulating board or a ceramic board and can be used as a light source for an indicator, illumination device, or display apparatus. In addition, each embodiment can be selectively applied to or combined with other embodiments without limitation.

The light emitting device or the light emitting device package can be applied to the illumination system. The lighting system includes an light unit shown in FIG. 10 and a backlight unit shown in FIG. 11 and can be used in a signal lamp, a head lamp of a vehicle, and a signboard.

Figure 10:
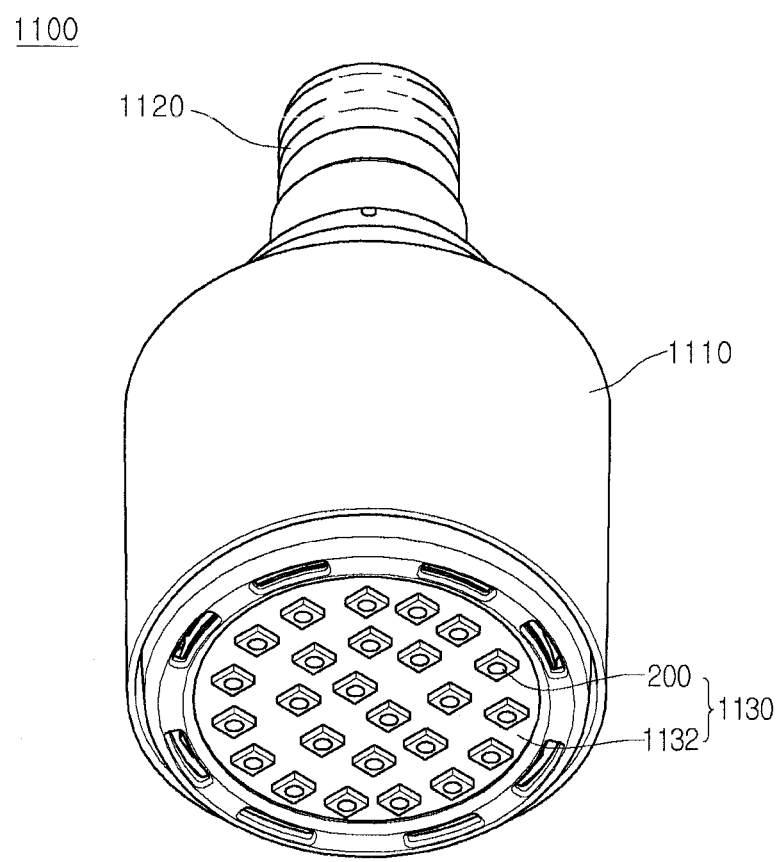
FIG. 10 is a diagram showing a light unit employing the light emitting device package of FIG. 9.

FIG. 10 shows an one embodiment of a light unit 1100 which includes a case 1110, a light emitting module 1130 installed in the case 1110, and a connection terminal 1120 installed in the case 1110 to receive power from an external power source. The case 1110 may be made of a material having superior heat dissipation characteristics such as but not limited to metal or resin.

The light emitting module 1130 may include a board 1132 and at least one light emitting device package 200 mounted on the board 1132. The light emitting device package 200 may include the light emitting device according to the embodiment.

The board 1132 includes an insulating member printed with a circuit pattern. For instance, the board 1132 includes a normal PCB (Printed Circuit Board), a metal core PCB, a flexible PCB, or a ceramic PCB.

In addition, the board 1132 is made of material capable of effectively reflecting the light. The board 1132 can be coated, or example, with a white color or a silver color capable of effectively reflecting the light.

At least one light emitting device package 200 can be mounted on the board 1132. Each light emitting device package 200 may include at least one LED 100. The LED 100 may include a color LED capable of emitting light having various colors of red, green, blue and white, and a UV LED that emits ultraviolet ray.

The light emitting module 1130 may have various combinations of the light emitting device packages 200 to achieve desired colors and brightness. For instance, a white LED, a red LED and a green LED can be selectively arranged to ensure the high CRI (color rendering index).

The connection terminal 1120 is electrically connected to the light emitting module 1130 to supply power. The connection terminal 1120 includes a socket rotatably coupled with the external power source, but the embodiment is not limited thereto. For instance, the connection terminal 1120 may include a pin which is inserted into the external power source or connected to the external power source through a wire.

Figure 11:
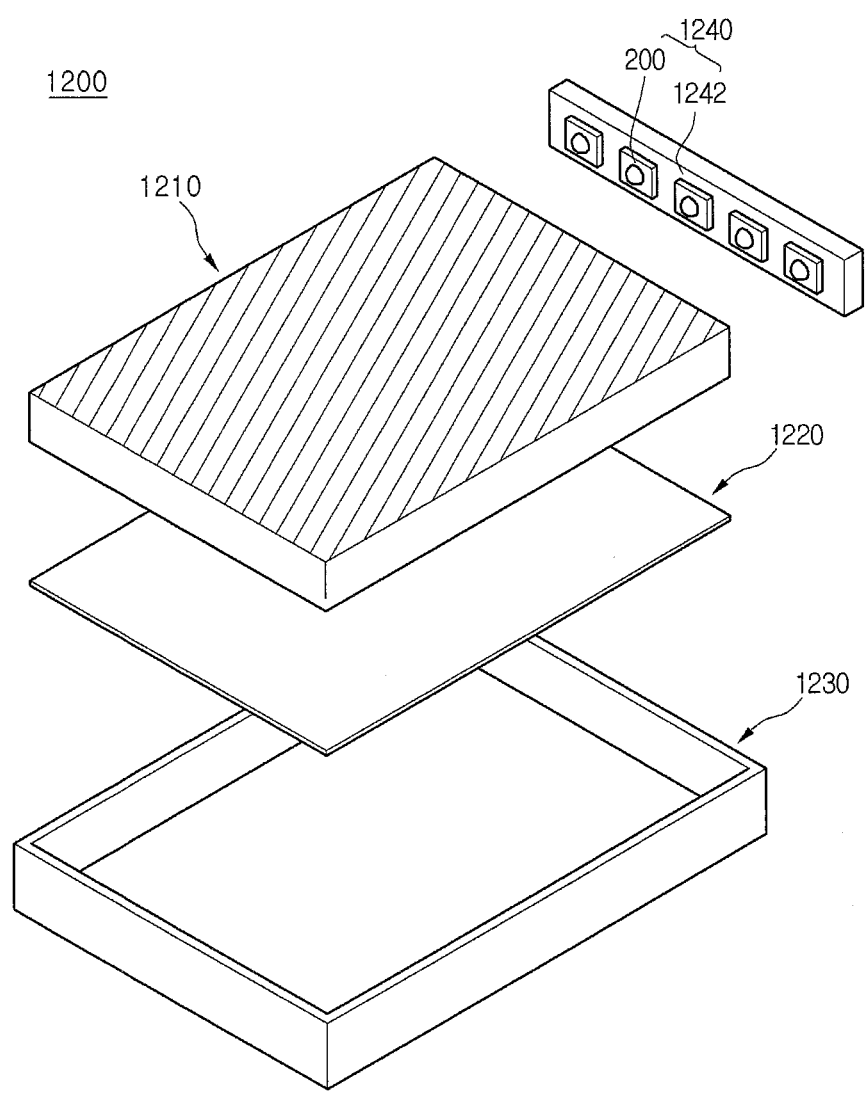
FIG. 11 is a diagram a backlight unit employing the light emitting device package of FIG. 9.

FIG. 11 shows one embodiment of a backlight unit 1200 which includes a light guide plate 1210, a light emitting module 1240 supplying light to the light guide plate 1210, a reflective member 1220 aligned under the light guide plate 1210, and a bottom cover 1230 receiving the light guide plate 1210, the light emitting module 1240 and the reflective member 1220.

The light guide plate 1210 diffuses the light to provide a surface light. The light guide plate 1210 includes transparent material. For instance, the light guide plate 1210 may include one of acryl resins such as PMMA (polymethyl methacrylate), PET (polyethylene terephthalate), PC (poly carbonate), COC (cyclo olefin copolymer) or PEN (polyethylene naphthalate).

The light emitting module 1240 supplies light to at least one side of the light guide plate 1210, so that the light emitting module 1240 serves as a light source of a display device employing the backlight unit. The light emitting module 1240 may include a direct illumination-type light emitting module. In this case, the light guide plate 1210 can be omitted from the backlight unit.

The light emitting device package 200 of the light emitting module 1240 is positioned adjacent to one side of the light guide plate 1210, but the embodiments are not limited thereto. In detail, the light emitting module 1240 includes a board 1242 and a plurality of light emitting device packages 200 formed on the board 1242. The light emitting device packages 200 can be mounted on a thermal plate or on a side of the bottom cover instead of the board 1242. The board 1242 is adjacent to the thermal plate or a metal having a superior heat dissipation characteristic.

The board 1242 may include a PCB printed with a circuit pattern (not shown). In addition, the board 1242 may include a metal core PCB or a flexible PCB, but the embodiment is not limited thereto.

An exit surface of the light emitting device package 200, through which the light is emitted to the board 1242, is spaced apart from the light guide plate 1210 by a predetermined distance.

The reflective member 1220 is provided under the light guide plate 1210. The reflective member 1220 reflects the light directed downward from the light guide plate 1210 such that the light is directed upward, thereby improving the brightness of the backlight unit. For instance, the reflective member 1220 may include one or more of PET, PC or PVC resin, but the embodiments are not limited thereto. The reflective member 1220 may include a reflective material coated on a upper surface of the bottom cover 1230, but the embodiments area not limited thereto.

The bottom cover 1230 can receive the light guide plate 1210, the light emitting module 1240 and the reflective member 1220 therein. To this end, the bottom cover 1230 may have, for example, a box shape with an open upper portion but the embodiments are not limited thereto.

The bottom cover 1230 can be fabricated through a pressing process or an extruding process by using a metal or resin.

One or more embodiments of the method for manufacturing a light emitting device includes the steps of forming a plurality of clusters on a substrate, forming a first semiconductor layer on the substrate to form air gaps on the clusters, and forming a second semiconductor layer on the air gaps.

One or more of these embodiments can remove the crystal defects of the nitride semiconductor layer while at the same time improving internal quantum efficiency and external quantum efficiency. These embodiments can also prevent current supplied under the active layer from being concentrated, and can improve electric reliability of the semiconductor light emitting device. The features disclosed in the above embodiments may not be limited to the embodiments described above, but can be selectively applied to other embodiments.

One or more embodiments described herein provide a light emitting device capable of preventing damage, such as a crack, from occurring in a semiconductor layer, and a light emitting device package having the same. This embodiment provides a light emitting device including a cluster layer and a porous semiconductor layer, and a light emitting device package having the same.

One or more embodiments described herein provide a light emitting device comprising: a cluster layer; a first porous semiconductor layer on the cluster layer; and a light emitting structure including a first conductive semiconductor layer on the first semiconductor layer, an active layer on the first conductive semiconductor layer, and a second conductive semiconductor layer on the active layer.

One or more embodiments described herein provide a light emitting device comprising: a substrate; a cluster layer having a plurality of openings on the substrate; a first porous semiconductor layer on the substrate; and a light emitting structure including a first conductive semiconductor layer on the first semiconductor layer, an active layer on the first conductive semiconductor layer, and a second conductive semiconductor layer on the active layer.

One or more embodiments described herein provide a light emitting device package comprising: a body; a plurality of lead electrodes on the body; and a light emitting device including a cluster layer, a first porous semiconductor layer on the cluster layer, and a light emitting structure including a first conductive semiconductor layer on the first semiconductor layer, an active layer on the first conductive semiconductor layer, and a second conductive semiconductor layer on the active layer.

One or more embodiments of a light emitting device comprises a substrate; a plurality of clusters spread on a surface of the substrate; a first semiconductor layer provided over the plurality of clusters, wherein the first semiconductor layer includes air gaps provided above the plurality of clusters; and a light emitting structure including a first conductive semiconductor layer adjacent to the first semiconductor layer, an active layer on the first conductive semiconductor layer, and a second conductive semiconductor layer on the active layer.

The clusters may comprise a MgN clusters or a Mg clusters, and the air gaps may bee aligned with the clusters. Also, the substrate may comprise at least one of a buffer layer of at least one of Group II to VI elements, an undoped semiconductor layer or a doped semiconductor layer under the cluster layer.

The first semiconductor layer may include at least one of an undoped semiconductor layer, a nonconductive semiconductor layer or a conductive semiconductor layer.

The second semiconductor layer between the first semiconductor layer and the first conductive semiconductor layer, and the second semiconductor layer may include a super lattice structure. At least one of the air gaps of the first semiconductor layer may have a conical shape. The air gaps may be aligned.

In addition, the substrate may be a conductive-type substrate, and a first electrode may be coupled to the first conductivity type semiconductor and a second electrode coupled to the second conductivity type semiconductor. A contact area between the first semiconductor layer and the substrate may be larger than a contact area between the first semiconductor layer and the cluster layer, and the substrate may be made of silicon. In addition, at least one of a transmissive electrode layer or a reflective electrode layer may be included on the second conductive semiconductor layer.

In accordance with another embodiment, a light emitting device package has any of the aforementioned embodiments of the light emitting device and may also have a package body and a plurality of lead electrodes on the package body. In addition, a molding member may be included to cover the light emitting device.

In accordance with the foregoing embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a substrate;
   a plurality of clusters disposed over a surface of the substrate;
   a first semiconductor layer disposed to contact and at least partially overlap upper surfaces of the plurality of clusters and to overlap the substrate, wherein the first semiconductor layer includes air gaps overlapping respective ones of the plurality of clusters;
   a second semiconductor layer disposed over the first semiconductor layer and the air gaps; and
   a light emitting structure over the second semiconductor layer, wherein the light emitting structure includes a first conductive semiconductor layer over the second semiconductor layer, an active layer over the first conductive semiconductor layer, and a second conductive semiconductor layer over the active layer, wherein the air gaps and respective ones of the plurality of clusters overlap one another along substantially vertical axes,
   wherein the clusters comprise at least one of MgN clusters or Mg clusters.

2. The light emitting device of claim 1, wherein the air gaps are aligned with the clusters.

3. The light emitting device of claim 1, wherein the substrate comprises at least one of a buffer layer of at least one of Group II to VI elements, an undoped semiconductor layer or a doped semiconductor layer under the cluster layer.

4. The light emitting device of claim 1, wherein the first semiconductor layer includes at least one of an undoped semiconductor layer, a nonconductive semiconductor layer or a conductive semiconductor layer.

5. The light emitting device of claim 1, wherein each of the plurality of clusters has a size that lies in a range of about 1 Å to about 9000 Å.

6. The light emitting device of claim 1, wherein the second semiconductor layer includes a super lattice structure.

7. The light emitting device of claim 1, wherein at least one of the air gaps of the first semiconductor layer has a conical shape.

8. The light emitting device of claim 1, wherein the substrate is a conductive type substrate.

9. The light emitting device of claim 1, further comprising a first electrode coupled to the first conductive type semiconductor and a second electrode coupled to the second conductive type semiconductor.

10. The light emitting device of claim 1, wherein the air gaps are disposed between the second semiconductor layer and the plurality of clusters.

11. The light emitting device of claim 1, wherein the second semiconductor layer is in contact with the first semiconductor layer.

12. The light emitting device of claim 1, wherein the substrate is made of silicon.

13. The light emitting device of claim 1, further comprising:
   at least one of a transparent electrode layer or a reflective electrode layer over the second conductive semiconductor layer.

14. A light emitting device package having the light emitting device of claim 1, and having a package body and a plurality of lead electrodes on the package body.

15. The light emitting device package of claim 14, further comprising a molding member covering the light emitting device.

16. The light emitting device package of claim 14, wherein each of the plurality of clusters has a size that lies in a range of about 1 Å to about 9000 Å.

17. The light emitting device package of claim 14, wherein a maximum width of the clusters is wider than a maximum width of the air gaps.

18. The light emitting device of claim 1, wherein a first portion of the first semiconductor layer is in contact with one of the plurality of clusters and a second portion of the first semiconductor layer is in contact with the substrate.

19. The light emitting device of claim 1, wherein each air gap is tapered by increasing width from a lower portion closer to the substrate to an upper portion closer to the second semiconductor layer.

20. The light emitting device of claim 1, wherein a maximum width of the clusters is wider than a maximum width of the air gaps.

* * * * *